(12) United States Patent
Lee et al.

(10) Patent No.: US 7,517,734 B2
(45) Date of Patent: Apr. 14, 2009

(54) METHOD OF MANUFACTURING A WAFER LEVEL PACKAGE WITH A CAP STRUCTURE FOR HERMETICALLY SEALING A MICRO DEVICE

(75) Inventors: Joo Ho Lee, Kyungki-do (KR); Jea Shik Shin, Kyungki-do (KR)

(73) Assignee: Samsung Electro-Mechanics Co., Ltd., Suwon, Kyungki-Do (KR)

(*) Notice: Subject to any disclaimer, the term of this patent is extended or adjusted under 35 U.S.C. 154(b) by 128 days.

(21) Appl. No.: 11/627,206

(22) Filed: Jan. 25, 2007

(65) Prior Publication Data

US 2007/0117245 A1    May 24, 2007

Related U.S. Application Data

(62) Division of application No. 10/790,723, filed on Mar. 3, 2004, now Pat. No. 7,173,324.

(30) Foreign Application Priority Data

Oct. 1, 2003    (KR)    ................. 10-2003-0068165

(51) Int. Cl.
    *H01L 21/58*    (2006.01)
(52) U.S. Cl. ................ 438/125; 438/667; 257/E21.505
(58) Field of Classification Search .................. 438/667
    See application file for complete search history.

(56) References Cited

U.S. PATENT DOCUMENTS

| | | | |
|---|---|---|---|
| 5,144,412 A | 9/1992 | Chang et al. | |
| 5,668,033 A | 9/1997 | Ohara et al. | |
| 5,801,068 A | 9/1998 | Sooriakumar et al. | |
| 6,106,735 A | * | 8/2000 | Kurle et al. ................ 216/2 |
| 6,114,191 A | 9/2000 | Young et al. | |
| 6,228,675 B1 | 5/2001 | Ruby et al. | |
| 6,452,238 B1 | 9/2002 | Orcutt et al. | |
| 6,492,194 B1 | 12/2002 | Bureau et al. | |

(Continued)

FOREIGN PATENT DOCUMENTS

DE    19700734    7/1998

(Continued)

OTHER PUBLICATIONS

German Patent Office, Office Action mailed Jun. 1, 2006, and English translation thereof.

(Continued)

*Primary Examiner*—Stephen W Smoot
(74) *Attorney, Agent, or Firm*—Lowe Hauptman Ham & Berner

(57) ABSTRACT

A wafer level package includes a device wafer having a micro device, and bonding pads which are connected to the micro device, and formed at one surface of the device wafer, via connectors extending from the bonding pads to the other surface of the device wafer, external bonding pads formed at the other surface of the device wafer and connected to the bonding pads through the via connectors, and a cap structure bonded to one surface of the device wafer so as to allow the micro device to be insulated and hermetically sealed.

6 Claims, 5 Drawing Sheets

U.S. PATENT DOCUMENTS

| | | |
|---|---|---|
| 6,777,263 B1 | 8/2004 | Gan et al. |
| 6,846,725 B2 | 1/2005 | Nagarajan et al. |
| 2002/0185712 A1 | 12/2002 | Stark et al. |

FOREIGN PATENT DOCUMENTS

| | | |
|---|---|---|
| DE | 198 00 574 | 7/1999 |
| JP | 4-293311 A | 10/1992 |
| JP | 06-318625 A | 11/1994 |
| JP | 11-299748 | 11/1999 |
| JP | 2000-077970 A | 3/2000 |
| JP | 2001-68580 A | 3/2001 |
| JP | 2001-068616 A | 3/2001 |
| JP | 2001-144117 | 5/2001 |
| JP | 2001-351997 A | 12/2001 |
| JP | 2003-163342 A | 6/2003 |
| WO | 03/017364 A1 | 2/2003 |

OTHER PUBLICATIONS

Japanese Patent Office, Office Action mailed Mar. 25, 2008 and English Translation.

* cited by examiner (a)

(b)

METHOD OF MANUFACTURING A WAFER LEVEL PACKAGE WITH A CAP STRUCTURE FOR HERMETICALLY SEALING A MICRO DEVICE

CROSS REFERENCE

This application is a divisional of U.S. Pat. No. 7,173,324, based upon U.S. application Ser. No. 10/790,723 filed Mar. 3, 2004, which claims priority from Korean Patent Application No. 10-2003-0068165 filed Oct. 1, 2003, the disclosures of which are hereby incorporated by reference herein in their entirety.

BACKGROUND OF THE INVENTION

1. Field of the Invention

The present invention relates to a wafer level package, and a manufacturing method thereof, and more particularly to a wafer level package and a manufacturing method thereof for forming a micro device, such as a film bulk acoustic resonator (hereinafter, referred to as an FBAR), into a chip scale package.

2. Description of the Related Art

According to recent rapid development of communication techniques, technical development of high frequency devices has become highly desirable. In response to such a demand, there was developed an FBAR device, which is a thin film filter device manufactured by depositing a piezoelectric material on a semiconductor substrate. Currently, the FBAR device is in the spotlight as an essential passive element in an RF wireless mobile communication field.

In general, micro devices such as FBAR devices are packaged to achieve a product such as a duplexer filter, and mounted to the product. Therefore, in order to achieve miniaturization in mobile communication products, it is necessary to reduce the overall size of an obtained micro device package.

Conventionally, the micro devices such as the FBAR devices are packaged by the use of a high temperature cofired ceramic (hereinafter, referred to as HTCC) substrate. FIG. 1 illustrates a conventional micro device package using such HTCC substrate.

As shown in FIG. 1, the conventional micro device package, designated as reference numeral 10, comprises a micro device 15, and an HTCC substrate 11 in which the micro device 15 is mounted. For the reception of the micro device 15, the HTCC substrate 11 is formed with a well 14. In a mounted state in the well 14, the micro device 15 is connected to bonding pads 12 placed on the HTCC substrate 11 through wires 19. Further, a cap layer 18 is formed over the HTCC substrate 11 in order to hermetically seal the well 14 in which the micro device 15 is mounted.

The micro device package 10 shown in FIG. 1 is manufactured by cutting a micro device prepared in wafer units while securing a sufficient chip die area, and then mounting the cut micro device in a structure having a size larger than that of the micro device. Such a micro device package 10 increases the size of a chip itself, and further the HTCC substrate 11 has a large size due to its stepped portion defined therein for the mounting of the micro device. Therefore, the conventional micro device package shown in FIG. 1 has a problem in that it is difficult to achieve miniaturization in the size of a final package. For example, in the case of an FBAR device package having a single FBAR device as shown in FIG. 1, since it has a size not less than 3 millimeters in length and width, it is very difficult to achieve a desired small size (for example, 5 millimeters in length and width) of a duplexer package having two FBAR devices.

In order to satisfy such a miniaturization demand, currently, there has been developed a wafer-level chip-scale package technique utilizing a certain process carried out at the wafer level where a micro device is formed. Such a wafer-level chip-scale package utilizes a cap structure, such as a cap wafer processed for the formation of a terminal. FIG. 2 is a side sectional view illustrating a conventional wafer level package using a cap wafer.

Referring to FIG. 2, the wafer level package, designated as reference numeral 40, comprises a device wafer 20 formed with a micro device 25 such as an FBAR device, and a cap wafer 30. The device wafer 20 includes electrical bonding pads 21 for use in the driving of the micro device 25 formed at the upper surface of the device wafer 20, and a peripheral pad 22 placed around the perimeter of the device wafer 20. The cap wafer 30 is formed with via holes H at some portions corresponding to the bonding pads 21 so as to allow the bonding pads 21 to be connected to certain external circuits (not shown) by bonding wires 39 therebetween.

In order to secure operational reliability of the micro device 25, between the cap wafer 30 and the device wafer 20 are provided first and second sealing members 23 and 24. Each of the first sealing members 23 is formed to have a ring shape, so that it is placed along the periphery of the respective bonding pads 21 for use in wire bonding, in order to prevent the micro device 25 from being exposed to the outside through the via holes H. The second sealing member 24 is formed on the peripheral pad 22 along the perimeter of the wafer level package 40.

Although the wafer level package 40 using a micro cap as shown in FIG. 2 is advantageous in miniaturization compared with a conventional wafer level package using an HTCC substrate, since the via holes H should be previously formed so as to correspond to the bonding pads 21, respectively, the processing of the cap wafer 30 is complex, resulting in difficulty in the overall manufacturing process thereof.

Further, as stated above, the wafer level package 40 shown in FIG. 2 should have the first sealing members 23, in order to prevent the micro device 25 from being exposed to the outside through the via holes H formed at the cap wafer 30 for connecting the bonding pads 21 provided on the device wafer 20 to certain external circuits. In this case, it is essential for the first sealing members 23 to be made of metal sealing members since they are formed on the metal bonding pads 21.

For the above reasons, there has been a need for a rigid chip scale wafer level package and a manufacturing method thereof, which can improve an overall yield by simplifying a process related with a cap structure such as a cap wafer, and secure the complete air-tight of the wafer level package.

SUMMARY OF THE INVENTION

Therefore, the present invention has been made in view of the above problems, and it is an object of the present invention to provide a wafer level package, which is configured in such a fashion that a package connection structure, for use in the connection of external circuits, is provided at a device wafer, thereby achieving miniaturization in a size of a resulting chip.

It is another object of the present invention to provide a method of manufacturing a wafer level package, which is performed in such a fashion that a package connection structure, for use in the connection of external circuits, is formed at a device wafer so as to enable the formation process of the package connection structure to be simultaneously performed in a semiconductor manufacturing process of the device wafer, without requiring a separate process related with a cap structure, thereby simplifying the overall manufacturing process of the wafer level package.

In accordance with one aspect of the present invention, the above and other objects can be accomplished by the provision of a wafer level package comprising: a device wafer having a micro device, and bonding pads connected to the micro device, which are formed at one surface of the device wafer; via connectors extending from the bonding pads to the other surface of the device wafer; external bonding pads formed at the other surface of the device wafer and adapted to be connected to the bonding pads through the via connectors, respectively; and a cap structure bonded to one surface of the device wafer so as to allow the micro device to be insulated and hermetically sealed.

Preferably, the cap structure may have a cavity at a portion corresponding to the micro device, and be made of a silicon wafer, glass wafer, or photosensitive dry film.

Preferably, the wafer level package may further comprise a sealing member for bonding the cap structure to the device wafer, thereby allowing the micro device to be hermetically sealed.

Preferably, the device wafer may further have a peripheral metal pad formed around a perimeter of one surface thereof to be bonded to the cap structure, and the sealing member may be a metal material formed on the peripheral metal pad. Alternatively, the sealing member is a glass frit or a resin based adhesive.

In the case of another embodiment using a cap structure made of a dry film, the cap structure may have a dry film structure formed on the device wafer, the dry film structure having a well for receiving the micro device, and a passivation layer applied to an outer surface of the dry film structure.

Preferably, the passivation layer may be a material selected from among the group consisting of an epoxy resin, thermosetting resin, metal and photosensitive resin.

In accordance with another aspect of the present invention, there is provided a method for manufacturing a wafer level package, comprising the steps of: a) preparing a device wafer in which a micro device, and bonding pads connected to the micro device are formed at one surface thereof; b) forming via connectors extending from the bonding pads to the other surface of the device wafer; c) bonding a cap structure to one surface of the device wafer so as to allow the micro device to be insulated and hermetically sealed; and d) forming external bonding pads at the other surface of the device wafer, the external bonding pads being connected to the bonding pads through the via connectors, respectively.

Preferably, the step b) includes: b-1) forming via holes having a predetermined depth in the bonding pads and hence the device wafer; b-2) applying a conductive material to the via holes so as to form the via connectors; and b-3) grinding the device wafer so as to allow the via connectors to be exposed to the outside from the other surface of the device wafer.

Preferably, the step b-3) may be selectively performed before or after the step c).

Preferably, the cap structure may be prepared by a process comprising the steps of: f) forming a dry film structure having a well for receiving the micro device and bonding pads, and g) applying a passivation layer to an outer surface of the dry film structure.

Here, the step f) may include: f-1) forming a side wall structure on one surface of the device wafer by the use of a dry film, the side wall structure having a height not less than that of the micro device so as to encompass a region where the micro device and bonding pads are formed; and f-2) forming a roof structure by the use of a dry film, the roof structure covering over the side wall structure.

According to the basic feature of the present invention, a package connection structure is formed at a device wafer of a wafer level package, differently from a conventional wafer level package. That is, as via connectors are formed at the device wafer, and further external bonding pads are formed at one surface of the device wafer so as to be connected to the via connectors, a package connection structure is provided at the device wafer.

Differently from a conventional micro-cap wafer level package wherein via holes are formed at a cap structure and adapted to expose bonding pads placed on a device wafer to the outside, a package connection structure in accordance with the present invention has no via holes at its cap structure, and eliminates the use of any ring-shaped sealing members, which are conventionally formed on the bonding pads. For this reason, since no sealing members are formed on metal bonding pads connected to a micro device, it is possible to completely eliminate any inferiority, such as a leakage, due to the conventional ring-shaped sealing members, and to bond the device wafer to the cap structure by using an adhesive, or by selectively adopting various methods including an anodic bonding technique, in addition to a metal sealing method.

In further view of a process, since a package connection structure of the present invention can be continuously formed during a semiconductor manufacturing process, which is usually applied for the formation of a device wafer, without requiring a separate process related with a cap structure, it is possible to manufacture an accurate wafer level package in a simplified manner.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 3:
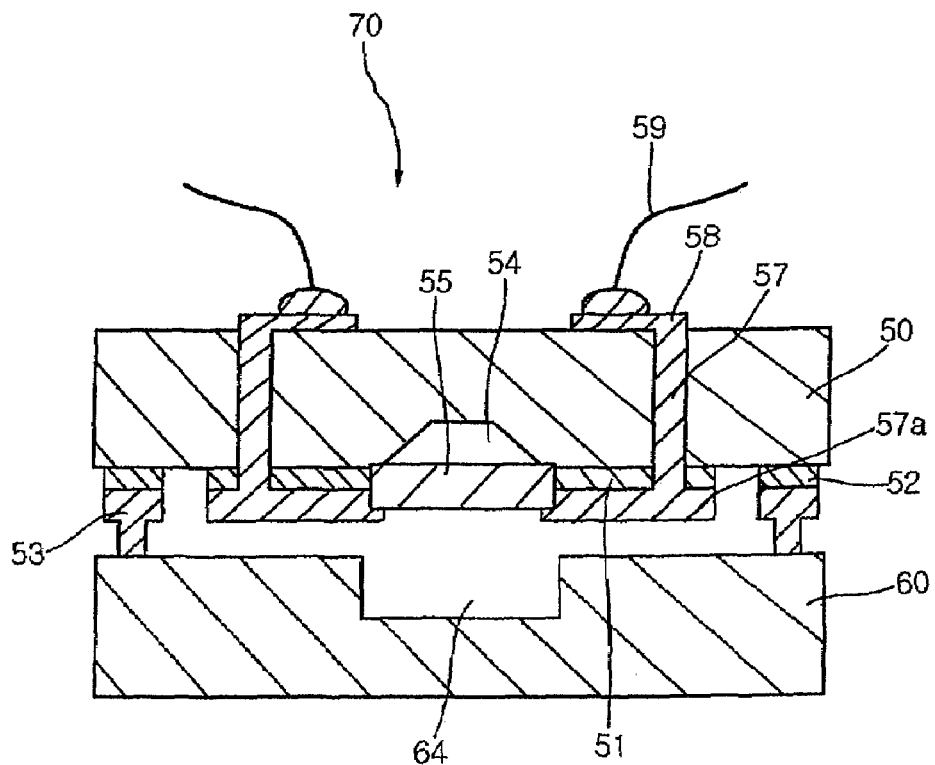
FIGS. 3a and 3b are a side sectional view and a bottom view, respectively, illustrating a wafer level package in accordance with an embodiment of the present invention.
Figure 3:
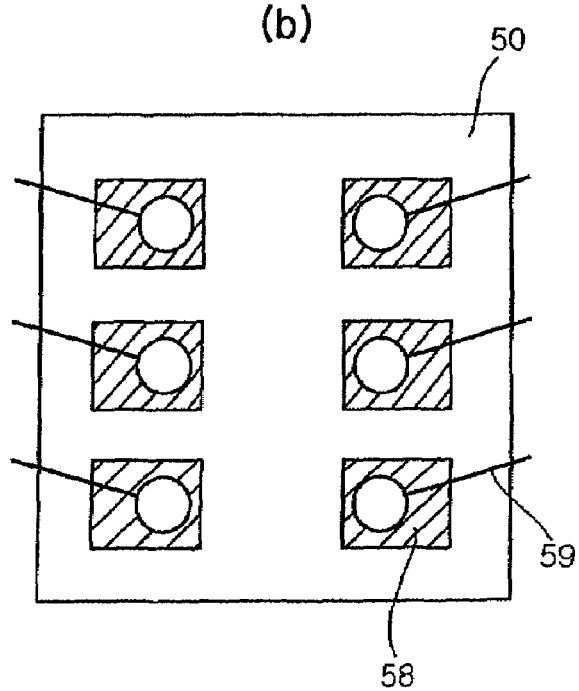

Referring to FIG. 3a, therein is shown a side section of a wafer level package, designated as reference numeral 70, comprising a device wafer 50, and a cap structure 60. The device wafer 50 is formed with an associated micro device 55, such as an FBAR device. The cap structure employed in the present embodiment is a cap wafer 60, which is made of the same silicon material as the device wafer 50. In addition to such a silicon wafer, the cap wafer 60 can be made of a glass wafer or photosensitive dry film. As shown in FIG. 3*a*, the cap wafer 60 has a cavity 64 at a region corresponding to the micro device 55.

The device wafer 50 further has bonding pads 51 for use in the driving of the micro device 55 formed at the upper surface of the device wafer 50, and a peripheral metal pad 52 formed around the perimeter of the upper surface. The micro device 55 can be an active device, such as an integrated circuit, or a passive device, such as a sensor. In the case of the present embodiment illustrating a resonance device, such as an FBAR device, the device wafer 50 can have an air gap 54 formed at a region where the micro device 55 is located.

The device wafer 50 has via connectors 57 extending from the respective bonding pads 51 to the lower surface thereof. The via connectors 57 can include conductive layer portions 57*a* at one side thereof, respectively, which are formed on the bonding pads 51 during applying conductive materials to the via holes. The via connectors 57 are connected at the other side thereof to external bonding pads 58 formed at the lower surface of the device wafer 50, respectively. Therefore, the external bonding pads 58 can be connected to the bonding pads 51 through the via connectors 57, respectively.

As the external bonding pads 58 are connected to certain external circuits (not shown) through wires 59 as shown in FIG. 3*b*, signals from the external circuits can be transmitted to the micro device 55.

Figure 1:
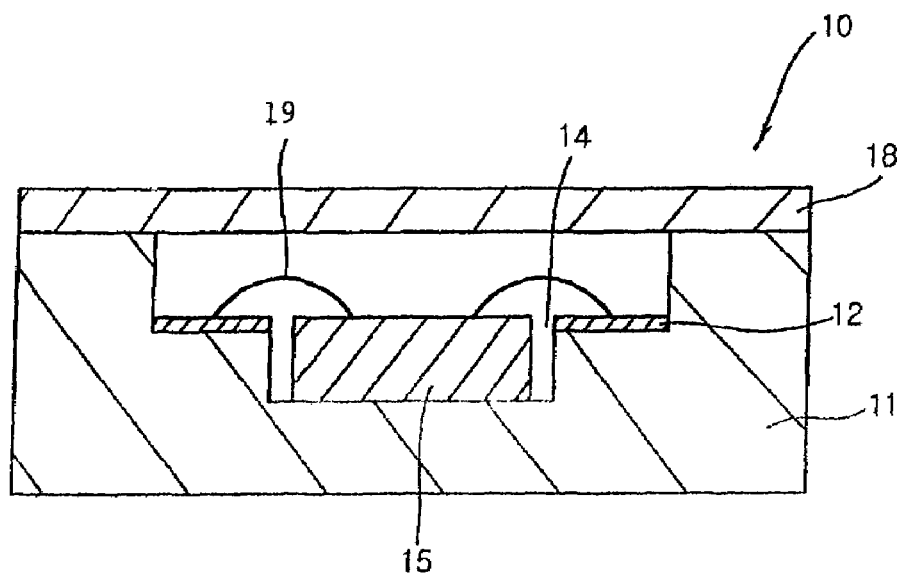
FIG. 1 is a side sectional view illustrating a micro device package using a conventional HTCC substrate.
Figure 2:
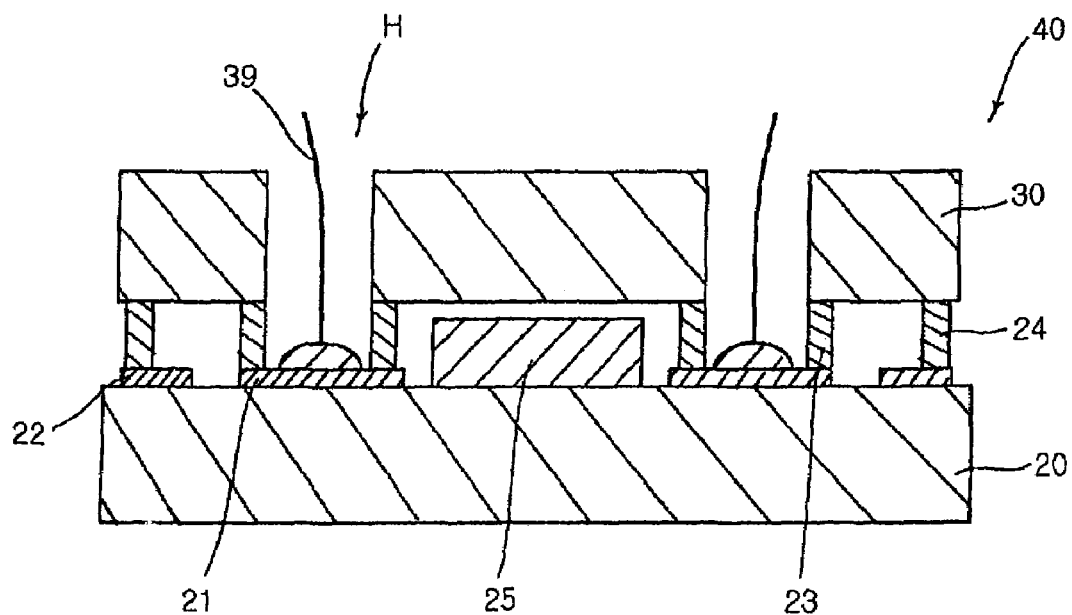
FIG. 2 is a side sectional view illustrating a conventional wafer level package.

As stated above, differently from the conventional wafer level package shown in FIG. 2, the wafer level package 70 in accordance with the present embodiment is formed at its device wafer 50 with the via connectors 57 and external bonding pads 58 to be connected to certain external circuits. This means that a package connection structure can be continuously formed with the manufacturing process of the device wafer 50 without requiring a separate process related with a cap structure 60. Further, the present invention provides an advantage in that there is no need for ring shaped sealing members, which are conventionally formed in order to prevent a micro device from being exposed to the outside due to via holes conventionally formed at a cap structure as shown in FIG. 2.

Referring again to FIG. 3*a*, the wafer level package 70 is formed with a metal sealing member 53 on the peripheral metal pad 52 placed around the perimeter of the upper surface of the device package 50. As the metal sealing member 53 is bonded to the cap wafer 60 at a high temperature, the micro device 55 mounted at the upper surface of the device wafer 50 can be insulated and hermetically sealed.

According to the present invention, the micro device 55 and bonding pads 51 located inside the wafer level package 70 can be maintained in an air-tight state by using various methods. Conventionally, a cap wafer is formed with via holes, and consequently ring-shaped sealing members should be formed on bonding pads for achieving sealing means for the via holes. Since such sealing members should be formed on the metal bonding pads, there is no choice but to fabricate the sealing members out of a metal material.

According to the package connection structure of the present invention, however, since the bonding pads 51 are not exposed to the outside through via holes formed at the cap wafer 60, it is unnecessary to form any sealing members on the bonding pads 51. Therefore, the use of metal sealing members is not an essential factor anymore. Further, since the sealing member 53 can be directly formed at the surface of the device wafer 50, the bonding thereof can be performed by selectively using a glass frit or resin based adhesive, or various other sealing means including an anodic bonding technique and the like.

Furthermore, since the overall package connection structure is formed at the device wafer 50, the cap structure can be made of various materials, in addition to a silicon wafer. Other embodiments employing the use of different materials will be explained with reference to FIGS. 5 and 6*a* to 6*d*.

FIGS. 4*a* to 4*e* are side sectional views illustrating the sequential steps of manufacturing the wafer level package in accordance with the embodiment of the present invention.

Figure 4:
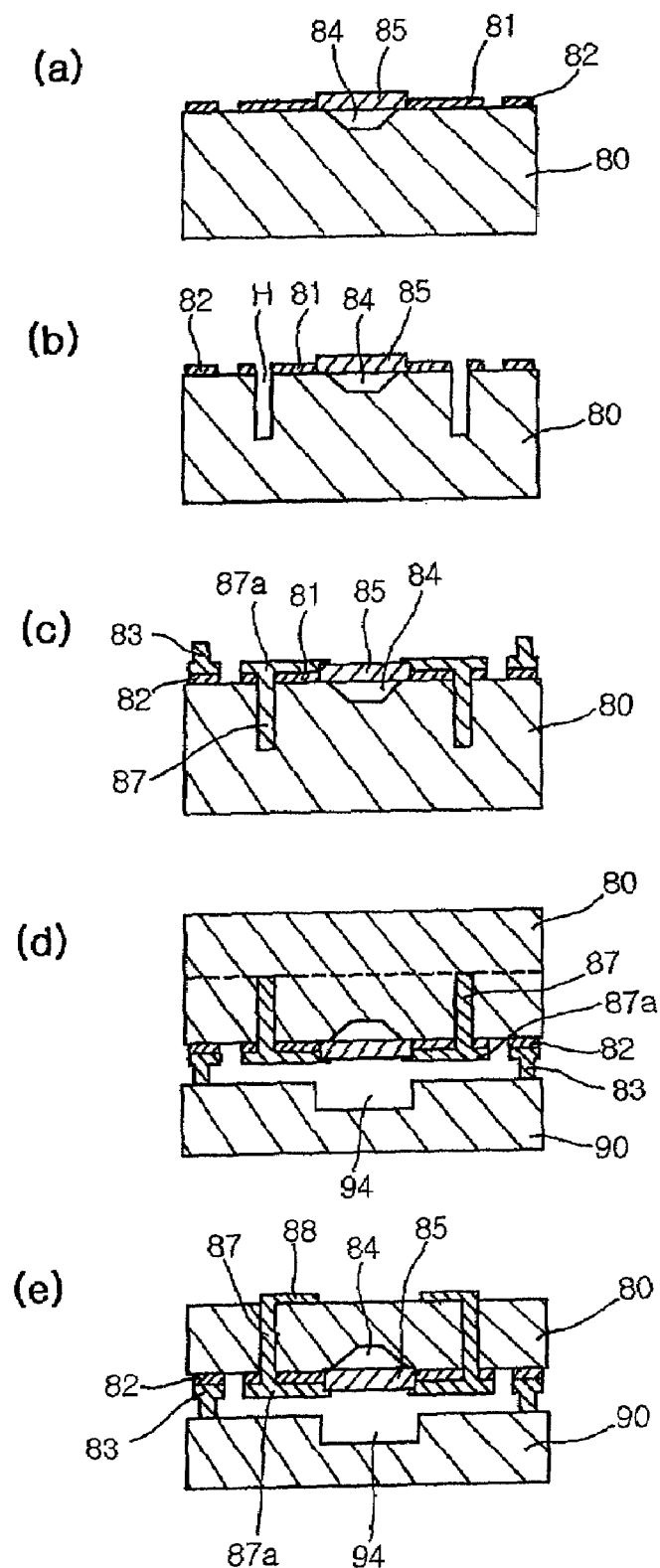
FIGS. 4a to 4e are side sectional views illustrating the sequential steps of manufacturing the wafer level package in accordance with the embodiment of the present invention.

As shown in FIG. 4*a*, the manufacturing method of the present invention begins from a step of preparing a device wafer 80, which is formed at the upper surface thereof with a micro device 85, and bonding pads 81 connected to the micro device 85. The device wafer 80 has a peripheral metal pad 82 placed around the perimeter of the upper surface thereof. The peripheral metal pad 82 can be formed at the same time with the formation of the bonding pads 81. In the present embodiment, the micro device 85 is an FBAR device, and hence the device wafer 80 can be formed with an air gap 84. Further, the micro device 85 is electrically connected to the bonding pads 81 by conductive leads (not shown).

Then, a step of forming via connectors, which extend from the bonding pads 81 toward the lower surface of the device wafer by a predetermined depth, is performed. FIGS. 4*b* to 4*d* illustrate a preferred example of the via connector forming step.

As shown in FIG. 4*b*, the bonding pads 81 and hence the device wafer 80 are formed with via holes H, which extend by a predetermined depth. Although the via holes H may be formed so as to completely penetrate the device wafer 80, preferably, the predetermined depth of the via holes H can be selected so as to be equal to or greater than the thickness of the device wafer portion, which will remain after a subsequent grinding process. Such a subsequent grinding process is performed at the lower surface of the device wafer 80 for achieving miniaturization in a resulting final package.

After completion of the via holes H, as shown in FIG. 4*c*, a conductive material is applied to the via holes H, thereby forming via connectors 87. The via connectors 87 can have conductive layer portions 87*a* placed on the bonding pads 81, respectively. During the formation of the via connectors 87, a sealing member 83 is formed on the peripheral metal pad 82 by the use of the same metal material as the via connectors 87.

Subsequently, as shown in FIG. 4*d*, the device wafer 80 is bonded to a cap wafer 90 by means of the metal sealing member 83. As a result, the micro device 85 can be insulated and hermetically sealed. The cap wafer 90 can be made of the same silicon material as the device wafer 80, and formed with a cavity 94 at a position corresponding to the micro device 85 so as to define a well capable of receiving the micro device 85.

In the present embodiment, a grinding process can be performed after the device wafer 80 is bonded to the cap wafer 90 as illustrated and explained in FIGS. 4*c* and 4*d*. Alternately, the grinding process can be performed before the device wafer 80 is bonded to the cap wafer 90.

After the device wafer 80 is bonded to the cap wafer 90, it is ground to a portion marked with a dotted line shown in FIG. 4*d*, thereby causing the via connectors 87 to be exposed to the outside from the grounded lower surface of the device wafer 80. Finally, as shown in FIG. 4*e*, the device wafer 80 is formed at the lower surface thereof with external bonding pads 89, which are connected to the bonding pads 81 through the via connectors 87, respectively. In this way, a package connection structure can be formed at the device wafer 80.

As can be seen from the above description, the present invention can eliminate the use of metal sealing members, and directly form a sealing member on the surface of the device wafer. The sealing member can be selected from among a glass frit or resin based adhesive, or other various sealing means including an anodic bonding technique and the like. The reason why such free selection of various sealing methods is acceptable is that, since the via connectors are formed at the device wafer, the bonding pads are not exposed through via holes conventionally formed at a cap wafer, thereby eliminating any need for forming sealing members on the bonding pads.

Figure 5:
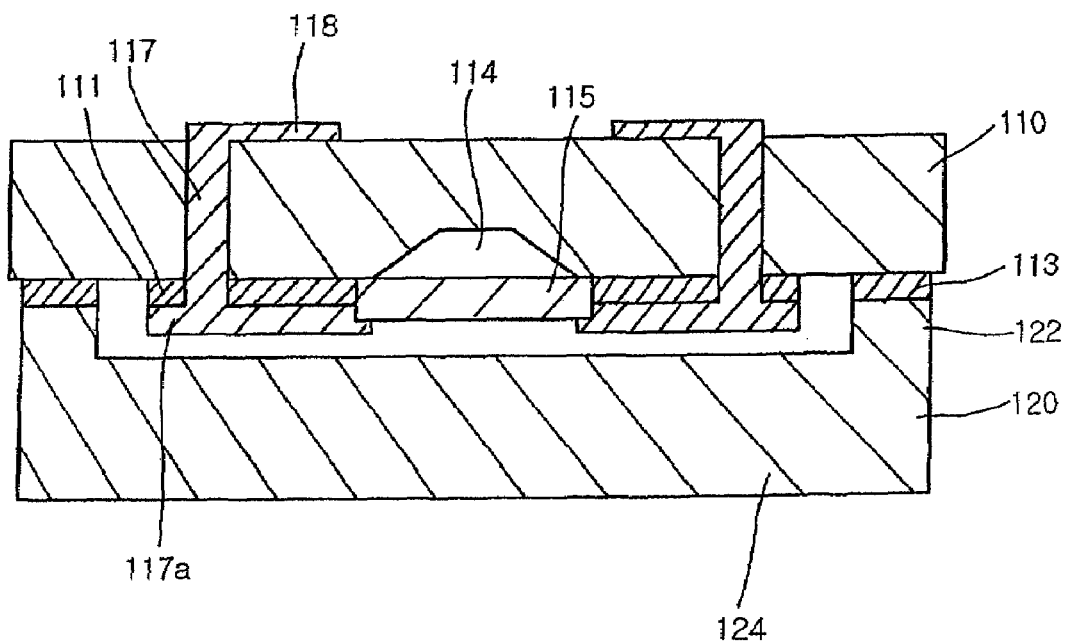
FIG. 5 is a side sectional view illustrating a wafer level package in accordance with another embodiment of the present invention.

FIG. 5 is a side sectional view illustrating a wafer level package, designated as reference numeral 130, in accordance with another embodiment of the present invention. The present embodiment is similar to the above embodiment shown in FIG. 3a in that a package connection structure is formed at a device wafer, but is different from the embodiment in relation to the structure of their cap wafers and bonding manners between the device wafer and cap wafer.

Referring to FIG. 5, the device wafer, designated as reference numeral 110, comprises bonding pads 111 for use in the driving of a micro device 115 formed at the upper surface thereof. The micro device 115 is an FBAR device, and hence the device wafer 110 can have an air gap 114 for the micro device 115.

Similar to the package connection structure shown in FIG. 3a, a package connection structure formed at the device wafer 110 comprises via connectors 117 extending from the bonding pads 111 to the lower surface of the device wafer 110, and the via connectors 117 are connected to external bonding pads 118 formed at the lower surface of the device wafer 110. In this way, the bonding pads 111 can be connected to certain external circuits through the via connectors 117 and external bonding pads 118, thereby completing a package connection structure.

A cap wafer 120 employed in the present embodiment is provided with a well 124 at a portion corresponding to the bonding pads 111 as well as the micro device 115 of the device wafer 110 so as to receive them. The cap wafer 120 is bonded to the upper surface of the device wafer 110 by the use of sealing members 113, which are made of a resin based adhesive, such as an epoxy resin. As stated above, since the present embodiment is designed so as to allow the cap wafer 120 to be directly bonded to the device wafer 110 through their silicon wafer surfaces without requiring a separate peripheral metal pad formed on the device wafer as shown in FIG. 3a, it allows the use of a conventional adhesive rather than a metal sealing member. Here, the acceptable sealing members 113 are not limited to the resin based adhesive, but can be achieved by using a glass frit or anodic bonding technique.

FIGS. 6a to 6d are side sectional views illustrating the sequential steps of manufacturing a wafer level package in accordance with yet another embodiment of the present invention. The present embodiment is similar to the above embodiments shown in FIGS. 3a and 5 in that a package connection structure is formed at a device wafer, but is different from them in that a cap structure thereof is made of a photosensitive dry film rather than a silicon wafer.

Figure 6:
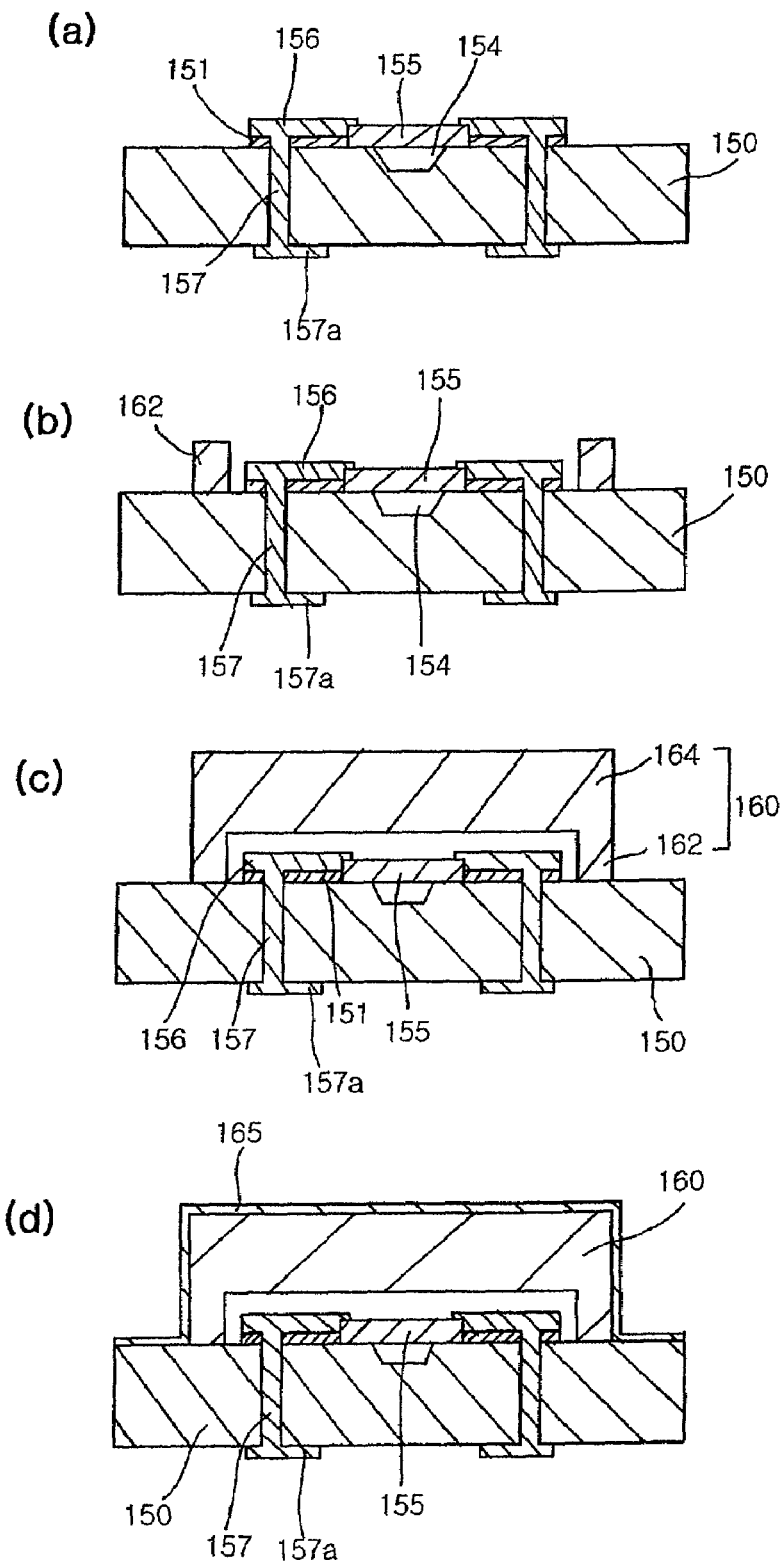
FIGS. 6a to 6d are side sectional views illustrating the sequential steps of manufacturing the wafer level package in accordance with yet another embodiment of the present invention.

As shown in FIG. 6a, first, a device wafer 150 having a package connection structure according to the present invention is prepared by using a process similar to that shown in FIGS. 4a to 4c. In the case of the present embodiment, however, via holes for use in the formation of via connectors are formed so as to completely penetrate a device wafer, or a grinding process is previously performed before the formation of the via holes, differently from that shown in FIG. 4b. That is, in a step shown in FIG. 6a, a micro device wafer 150 is primarily formed with a micro device 155, bonding pads 151 and an air gap 154, and secondarily formed with via connectors 157 extending from the bonding pads 151 to the lower surface of the device wafer 150, and external bonding pads 158 placed at the lower surface of the device wafer 150 so as to be connected to the via connectors 157.

Subsequently, as shown in FIG. 6b, a side wall structure 162 is formed at the upper surface of the device wafer 150 by the use of a dry film, so as to encompass a region where the micro device 155 and bonding pads 151 are formed. The side wall structure 162 has a height not less than that of the micro device 155. The formation of the side structure 162 can be implemented by laminating a photosensitive dry film at the upper surface of the device wafer 150, and selectively removing the region where the micro device 155 and bonding pads 151 are formed, thereby allowing some portions of the dry film corresponding to the side structure 162 to remain.

After that, as shown in FIG. 6c, a roof structure 164 is formed so as to cover over the side wall structure 162 by the use of a dry film. As a result, a cap structure 160 is obtained for hermetically sealing and protecting the region where the micro device 155 and bonding pads 151 are formed. In other words, the formation of the cap structure 160 can be implemented by laminating a dry film constituting the loop structure 164 at the upper end of the side wall structure 162 so as to cause the region encompassed by the side wall structure 162 to be hermetically sealed.

As shown in FIG. 6d illustrating the last step of the method of manufacturing the wafer level package, a passivation layer 165 is applied to the outer surface of the cap structure 160. The passivation layer 165 is a protective layer for the cap structure 160, and can be made of a material selected from among the ground consisting of an epoxy resin, thermosetting resin, metal and photosensitive resin.

As apparent from the above description, the present invention provides a wafer level package, which is configured in such a fashion that a package connection structure, for use in the connection of external circuits, is formed at a device wafer rather than a cap structure, thereby allowing the package connection structure to be continuously formed during a semiconductor manufacturing process for the formation of a device, without requiring a separate process related with the cap wafer. Further, according to the present invention, sealing members do not need to be formed on bonding pads for the bonding between the device wafer and cap wafer, differently from a conventional method, and the device wafer and cap wafer can be bonded by adopting various cap structures and sealing techniques, other than a metal sealing technique.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a wafer level package, said method comprising the steps of:

preparing a device wafer in which a micro device, and bonding pads connected to the micro device are formed at one surface thereof;

forming via connectors extending from the bonding pads to the other surface of the device wafer;

bonding a cap structure to one surface of the device wafer so as to allow the micro device to be insulated and hermetically sealed; and forming external bonding pads at the other surface of the device wafer, the external bonding pads being connected to the bonding pads through the via connectors, respectively;

wherein the cap structure is prepared by a process comprising the steps of:

forming a photosensitive dry film structure having a well for receiving the micro device and bonding pads, and applying a passivation layer to an outer surface of the dry film structure.

2. The method as set forth in claim 1, wherein the step of forming via conductors includes:

forming via holes having a predetermined depth in the bonding pads and hence the device wafer;

applying a conductive material to the via holes so as to form the via connectors; and grinding the device wafer so as to allow the via connectors to be exposed to the outside from the other surface of the device wafer.

3. The method as set forth in claim 2, wherein grinding the device wafer is performed before or after applying the conductive material.

4. The method as set forth in claim 1, wherein the cap structure has a cavity at a portion corresponding to the micro device.

5. The method as set forth in claim 1, wherein the step of forming a dry film structure includes:

forming a side wall structure on one surface of the device wafer by the use of a dry film, the side wall structure having a height not less than that of the micro device so as to encompass a region where the micro device and bonding pads are formed; and forming a roof structure by the use of a dry film, the roof structure covering over the side wall structure.

6. The method as set forth in claim 5, wherein the passivation layer is a material selected from among the group consisting of an epoxy resin, thermosetting resin, metal and photosensitive resin.

* * * * *